(12) United States Patent
Miyamoto et al.

(10) Patent No.: US 11,337,314 B2
(45) Date of Patent: May 17, 2022

(54) SURFACE TREATED COPPER FOIL, COPPER CLAD LAMINATE, AND PRINTED CIRCUIT BOARD

(71) Applicant: JX Nippon Mining & Metals Corporation, Tokyo (JP)

(72) Inventors: Nobuaki Miyamoto, Ibaraki (JP); Atsushi Miki, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 224 days.

(21) Appl. No.: 16/497,996

(22) PCT Filed: Apr. 22, 2019

(86) PCT No.: PCT/JP2019/017096
§ 371 (c)(1),
(2) Date: Sep. 26, 2019

(87) PCT Pub. No.: WO2019/208525
PCT Pub. Date: Oct. 31, 2019

(65) Prior Publication Data
US 2021/0360785 A1 Nov. 18, 2021

(30) Foreign Application Priority Data

Apr. 27, 2018 (JP) .............................. JP2018-087551
Apr. 27, 2018 (JP) .............................. JP2018-087554
(Continued)

(51) Int. Cl.
*H05K 1/02* (2006.01)
*H05K 1/03* (2006.01)
(Continued)

(52) U.S. Cl.
CPC ............. *H05K 3/384* (2013.01); *B32B 15/01* (2013.01); *B32B 15/04* (2013.01); *B32B 15/20* (2013.01);
(Continued)

(58) Field of Classification Search
CPC .. H05K 1/02; H05K 1/03; H05K 1/09; H05K 1/11; H05K 3/00; H05K 3/02; H05K 3/38;
(Continued)

(56) References Cited

U.S. PATENT DOCUMENTS 5,389,446 A 2/1995 Yamanishi et al.
5,456,817 A 10/1995 Hino et al.
(Continued)

FOREIGN PATENT DOCUMENTS

EP 2444530 A1 4/2012
JP 2849059 B2 1/1999
(Continued)

OTHER PUBLICATIONS

International Preliminary Report on Patentability dated Nov. 5, 2020 in corresponding PCT application No. PCT/JP2019/017096.
(Continued)

*Primary Examiner* — Xiaoliang Chen
(74) *Attorney, Agent, or Firm* — Nields, Lemack & Frame, LLC

(57) ABSTRACT

A surface treated copper foil 1 includes a copper foil 2, and a first surface treatment layer 3 formed on one surface of the copper foil 2. The first surface treatment layer 3 of the surface treated copper foil 1 has a root mean square gradient of roughness curve elements RΔq according to JIS B0601: 2013 of 5 to 28°. A copper clad laminate 10 includes the
(Continued)

Etching residue surface treated copper foil 1 and an insulating substrate 11 adhered to the first surface treatment layer 3 of the surface treated copper foil 1.

20 Claims, 2 Drawing Sheets

(30) Foreign Application Priority Data

| | | |
|---|---|---|
| May 31, 2018 | (JP) | JP2018-105116 |
| Jul. 19, 2018 | (JP) | JP2018-136096 |

(51) Int. Cl.

| | |
|---|---|
| *H05K 1/09* | (2006.01) |
| *H05K 1/11* | (2006.01) |
| *H05K 3/00* | (2006.01) |
| *H05K 3/02* | (2006.01) |
| *H05K 3/38* | (2006.01) |
| *H05K 3/46* | (2006.01) |
| *H01L 21/56* | (2006.01) |
| *B21D 37/01* | (2006.01) |
| *B23B 27/14* | (2006.01) |
| *C03C 17/10* | (2006.01) |
| *C03C 17/34* | (2006.01) |
| *C03C 17/36* | (2006.01) |
| *C23C 28/04* | (2006.01) |
| *C23C 14/06* | (2006.01) |
| *E06B 3/67* | (2006.01) |
| *B32B 15/01* | (2006.01) |
| *B32B 15/04* | (2006.01) |
| *B32B 15/08* | (2006.01) |
| *B32B 15/20* | (2006.01) |
| *C25D 5/00* | (2006.01) |
| *C25D 5/12* | (2006.01) |
| *H05K 3/06* | (2006.01) |
| *C22C 9/04* | (2006.01) |
| *C25D 5/14* | (2006.01) |
| *C25D 3/04* | (2006.01) |
| *C25D 3/12* | (2006.01) |
| *C25D 3/38* | (2006.01) |
| *C25D 3/56* | (2006.01) |
| *C25D 11/38* | (2006.01) |

(52) U.S. Cl.
CPC .......... *C22C 9/04* (2013.01); *C25D 5/12* (2013.01); *C25D 5/605* (2020.08); *C25D 5/627* (2020.08); *H05K 1/09* (2013.01); *H05K 3/022* (2013.01); *H05K 3/06* (2013.01); *B32B 2307/206* (2013.01); *B32B 2457/08* (2013.01); *C25D 3/04* (2013.01); *C25D 3/12* (2013.01); *C25D 3/38* (2013.01); *C25D 3/562* (2013.01); *C25D 5/14* (2013.01); *C25D 11/38* (2013.01); *H05K 2201/0338* (2013.01); *H05K 2201/0355* (2013.01); *H05K 2203/0307* (2013.01)

(58) Field of Classification Search
CPC ........... H05K 3/46; H01L 21/56; B32B 15/01; B32B 15/04; B32B 15/08; B32B 15/20; B21D 37/01; B23B 27/14; E06B 3/67; C03C 17/10; C03C 17/34; C03C 17/36; C03C 28/04; C03C 14/024; C03C 14/06
USPC ........ 174/257, 250, 255, 266; 428/127, 457, 428/577, 607, 624, 658, 667; 361/679.01; 362/606
See application file for complete search history.

(56) References Cited

U.S. PATENT DOCUMENTS

| | | | |
|---|---|---|---|
| 5,552,234 | A | 9/1996 | Kawasumi |
| 6,319,621 | B1 | 11/2001 | Arai et al. |
| 8,142,905 | B2 | 3/2012 | Moriyama et al. |
| 2002/0053517 | A1 | 5/2002 | Endo et al. |
| 2002/0182433 | A1 | 12/2002 | Endo |
| 2003/0031888 | A1 | 2/2003 | Kitano et al. |
| 2004/0191560 | A1 | 9/2004 | Matsuda et al. |
| 2010/0212941 | A1 | 8/2010 | Higuchi |
| 2010/0261033 | A1 | 10/2010 | Moriyama et al. |
| 2011/0189501 | A1 | 8/2011 | Fujisawa et al. |
| 2011/0259848 | A1* | 10/2011 | Yamanishi ............... C23C 22/24 216/13 |
| 2011/0262764 | A1 | 10/2011 | Arai et al. |
| 2011/0284496 | A1 | 11/2011 | Yamanishi et al. |
| 2011/0293960 | A1* | 12/2011 | Yamanishi ............... C25D 5/022 428/607 |
| 2011/0297641 | A1* | 12/2011 | Yamanishi ............ B32B 15/018 216/13 |
| 2011/0300401 | A1 | 12/2011 | Yamanishi et al. |
| 2012/0135266 | A1* | 5/2012 | Kaminaga ............... B32B 15/01 428/624 |
| 2012/0148862 | A1 | 6/2012 | Moriyama et al. |
| 2012/0276412 | A1 | 11/2012 | Miki |
| 2013/0011690 | A1 | 1/2013 | Arai et al. |
| 2013/0040162 | A1 | 2/2013 | Fujisawa et al. |
| 2014/0016348 | A1* | 1/2014 | Iwasaki ................ G02B 6/0041 362/606 |
| 2014/0057123 | A1 | 2/2014 | Arai et al. |
| 2014/0093743 | A1 | 4/2014 | Arai et al. |
| 2014/0146454 | A1* | 5/2014 | Nozawa ................ G02B 5/0226 361/679.01 |
| 2014/0355229 | A1 | 12/2014 | Arai et al. |
| 2015/0008020 | A1* | 1/2015 | Kaneko .................. H05K 3/465 174/257 |
| 2015/0047884 | A1* | 2/2015 | Nagaura .................... B32B 3/30 174/255 |
| 2015/0079415 | A1 | 3/2015 | Fukuchi |
| 2015/0237737 | A1 | 8/2015 | Arai et al. |
| 2015/0245477 | A1 | 8/2015 | Arai et al. |
| 2016/0189986 | A1* | 6/2016 | Kasai ...................... B29C 43/18 438/127 |
| 2016/0242281 | A1 | 8/2016 | Nagaura et al. |
| 2016/0286665 | A1 | 9/2016 | Arai et al. |
| 2016/0303829 | A1 | 10/2016 | Arai et al. |
| 2016/0374205 | A1* | 12/2016 | Moriyama ............. H05K 3/025 |
| 2017/0032978 | A1 | 2/2017 | Moriyama et al. |
| 2017/0034926 | A1 | 2/2017 | Moriyama et al. |
| 2017/0144355 | A1* | 5/2017 | Kuwabara ............ B32B 27/286 |
| 2017/0336535 | A1* | 11/2017 | Shima ................ B29C 45/0005 |
| 2018/0160529 | A1 | 6/2018 | Arai et al. |
| 2018/0226655 | A1 | 8/2018 | Arai et al. |
| 2018/0228029 | A1 | 8/2018 | Moriyama |
| 2018/0255646 | A1 | 9/2018 | Moriyama |
| 2018/0288867 | A1 | 10/2018 | Fukuchi |
| 2019/0145014 | A1 | 5/2019 | Chen et al. |
| 2021/0331449 | A1 | 10/2021 | Miyamoto et al. |
| 2021/0337664 | A1 | 10/2021 | Miyamoto et al. |
| 2021/0362475 | A1 | 11/2021 | Miyamoto et al. |

FOREIGN PATENT DOCUMENTS

| | | |
|---|---|---|
| JP | 2011-9267 A | 1/2011 |
| JP | 5204908 B1 | 6/2013 |
| JP | 2016-010961 A | 1/2016 |
| KR | 2012-0135197 A | 12/2012 |
| PH | 12014000344 A1 | 6/2016 |
| TW | I422484 B | 1/2014 |
| TW | 201526726 A | 7/2015 |
| TW | I530234 B | 4/2016 |
| TW | 201619448 A | 6/2016 |
| TW | I619409 B | 3/2018 |
| WO | 2010/074053 A1 | 7/2010 |
| WO | 2010/074061 A1 | 7/2010 |
| WO | 2010/074072 A1 | 7/2010 |

(56) References Cited

FOREIGN PATENT DOCUMENTS

| WO | 2010/147013 A1 | 12/2010 |
| WO | 2011/105318 A1 | 9/2011 |
| WO | 2016/035604 A1 | 3/2016 |
| WO | 2016/038923 A1 | 3/2016 |
| WO | 2017/006739 A1 | 1/2017 |

OTHER PUBLICATIONS

International Preliminary Report on Patentability dated Nov. 5, 2020 in co-pending PCT application No. PCT/JP2019/017092.
International Preliminary Report on Patentability dated Nov. 5, 2020 in co-pending PCT application No. PCT/JP2019/017091.
International Preliminary Report on Patentability dated Nov. 5, 2020 in co-pending PCT application No. PCT/JP2019/017093.
Office action dated Aug. 13, 2021 in co-pending U.S. Appl. No. 16/498,032.
International Search Report dated Jun. 11, 2019 in corresponding PCT application No. PCT/JP2019/017096.
International Search Report dated Jun. 11, 2019 in co-pending PCT application No. PCT/JP2019/017092.
International Search Report dated Jun. 11, 2019 in co-pending PCT application No. PCT/JP2019/017091.
International Search Report dated Jun. 11, 2019 in co-pending PCT application No. PCT/JP2019/017093.
"Definition of Surface Texture and Stylus Instrument", Accretech, Tokyo Seimitsu, pp. 230-237, 2018.
Japanese Industrial Standard, "Geometrical Product Specifications (GPS)-Surface texture: Profile method—Terms, definitions and surface texture parameters", 2013.
Konica Minolta, Precise Color Communication, "Let's look at some color spaces.", 2019, accessed Jan. 20, 2022, <https://www.konicaminolta.com/instruments/knowledge/color/part1/07.html>.
Olympus, Industrial Microscopes, "Surface Roughness Measurement—Parameters", 2020, accessed Jan. 20, 2022, <https://www.olympus-ims.com/en/metrology/surface-roughness-measurement-portal/parameters/>.
SpecsGroup, "Sputter Depth Profiling", Aug. 2020, accessed Jan. 20, 2022, <https://www.specs-group.com/nc/specsgroup/knowledge/methods/detail/sputter-depth-profiling/>.
Strohmeier et al., "Advanced Depth Profiling Characterization of Mixed Organic/Inorganic Layers Using X-ray Photoelectron Spectroscopy (XPS) and a Combined Monatomic and Gas Cluster Ion Source (MAGCIS)", Thermo Fisher Scientific, 2013.
Taylor Hobson, Resource Center, "What are Hybrid Parameters?", accessed Jan. 24, 2022, <https://www.taylor-hobson.com/resource-center/faq/what-are-hybrid-parameters>2020.
Wikipedia, "Surface roughness", 2021, accessed Jan. 20, 2022, <https://en.wikipedia.org/wiki/Surface_roughness>.
Final rejection dated Jan. 21, 2022 in co-pending U.S. Appl. No. 16/498,010.
Korean communication, with English translation, dated Oct. 26, 2021 in corresponding Korean patent application No. 10-2020-7029313.
European communication dated Dec. 7, 2021 in co-pending European patent application No. 19793376.5.
Office action dated Oct. 13, 2021 in co-pending U.S. Appl. No. 16/498,003.
Office action dated Oct. 22, 2021 in co-pending U.S. Appl. No. 16/498,010.
Final Rejection dated Oct. 28, 2021 in co-pending U.S. Appl. No. 16/498,032.
Final rejection dated Jan. 31, 2022 in co-pending U.S. Appl. No. 16/498,003.
Notice of allowance dated Mar. 1, 2022 in co-pending U.S. Appl. No. 16/498,032.

* cited by examiner

[Figure 1]
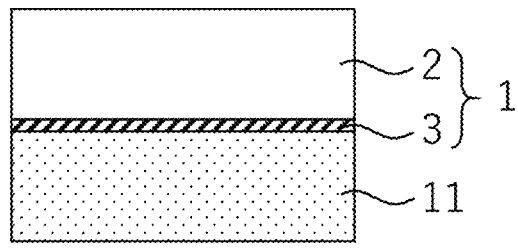
[Figure 2]
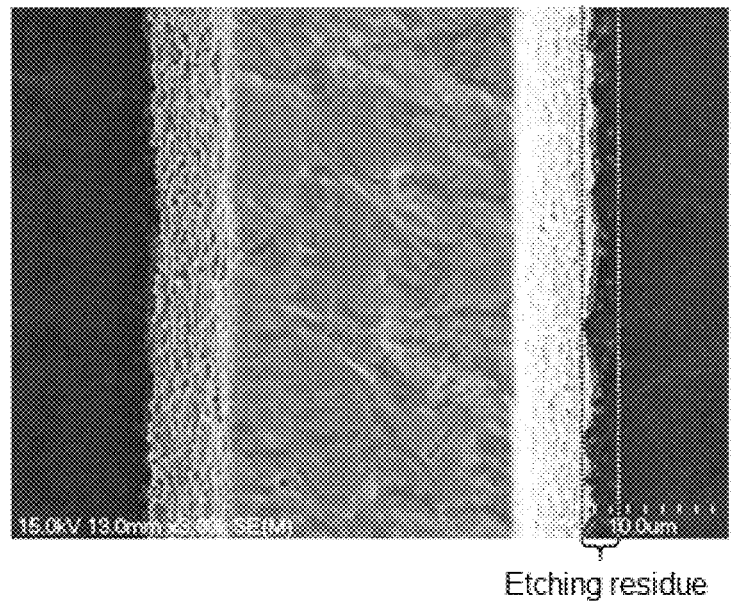
Etching residue

[Figure 3]
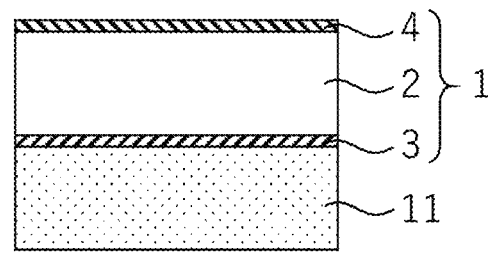
[Figure 4]
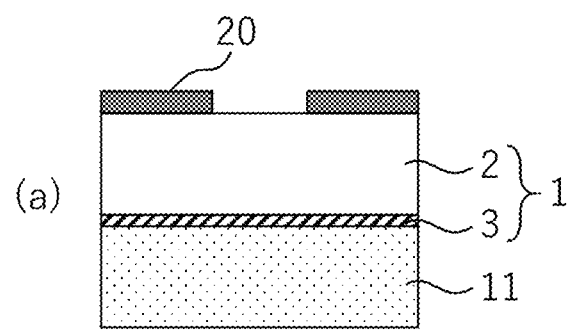
(a)
(b)
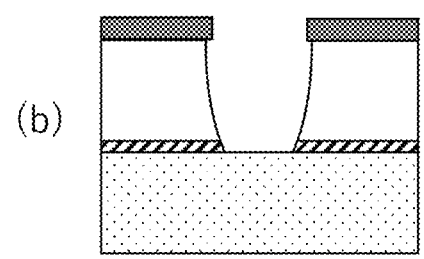
(c)
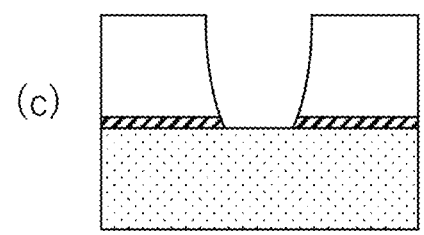

SURFACE TREATED COPPER FOIL, COPPER CLAD LAMINATE, AND PRINTED CIRCUIT BOARD

TECHNICAL FIELD

The present disclosure relates to a surface treated copper foil, a copper clad laminate, and a printed circuit board.

BACKGROUND ART

Associated with the increase of needs in electronic devices, such as reduction in size and enhancement of capability, in recent years, there has been a demand of reduction in pitch (miniaturization) of a circuit pattern (which may be referred to as a conductor pattern) of a printed circuit board mounted on the electronic devices.

Various methods, such as a subtractive method and a semi-additive method, have been known as a production method of the printed circuit board. In the subtractive method among these, an insulating substrate is adhered to a copper foil to form a copper clad laminate, then a resist is coated on the surface of the copper foil and then exposed to form a prescribed resist pattern, and the portion having no resist pattern formed (i.e., the unnecessary portion) is removed by etching, so as to form a circuit pattern.

For addressing the needs of reduction in pitch described above, for example, PTL 1 describes that the surface of a copper foil is subjected to a roughening treatment through copper-cobalt-nickel alloy plating, on which a cobalt-nickel alloy plated layer is then formed, and a zinc-nickel alloy plated layer is further formed thereon, so as to provide a surface treated copper foil that is capable of achieving the reduction in pitch of the circuit pattern.

CITATION LIST

Patent Literature

PTL 1: Japanese Patent No. 2,849,059

SUMMARY OF INVENTION

Technical Problem

However, the ordinary surface treated copper foil has a problem that the etching rate of the surface treatment layer (plated layer) is smaller than the etching rate of the copper foil, and therefore the copper foil is etched in a tapered shape expanding from the surface of the copper foil (top) to the insulating substrate (bottom), so as to lower the etching factor of the circuit pattern. In a circuit pattern having a low etching factor, the space between the circuits adjacent to each other is necessarily increased to make difficult the reduction in pitch of the circuit pattern.

A circuit pattern is also generally demanded to be hardly peeled off from an insulating substrate, but the adhesion to an insulating substrate is becoming difficult to secure associated with the reduction in pitch of a circuit pattern. Accordingly, it is becoming necessary to enhance the adhesion between the circuit pattern and the insulating substrate.

One or more embodiments of the present application have been made for solving the aforementioned problem, and an object thereof is to provide a surface treated copper foil and a copper clad laminate that are excellent in adhesion to an insulating substrate, and are capable of forming a circuit pattern having a high etching factor suitable for the reduction in pitch.

Another object of one or more embodiments of the present application is to provide a printed circuit board that has a circuit pattern having a high etching factor excellent in adhesion to an insulating substrate.

Solution to Problem

The present inventors have made earnest investigations for solving the problem, and as a result, have found that both the adhesion of the circuit pattern to the insulating substrate and the etching factor of the circuit pattern can be enhanced in such a manner that on a surface treatment layer formed on one surface of a copper foil, the root mean square gradient of roughness curve elements $R\Delta q$ according to JIS B0601:2013 is controlled to a particular range, and thus one or more embodiments of the present application have been completed.

Accordingly, one or more embodiments of the present application relate to a surface treated copper foil including a copper foil, and a first surface treatment layer formed on one surface of the copper foil, wherein the first surface treatment layer has a root mean square gradient of roughness curve elements $R\Delta q$ according to JIS B0601:2013 of 5 to 28°.

One or more embodiments of the present application also relate to a copper clad laminate including the surface treated copper foil and an insulating substrate adhered to the first surface treatment layer of the surface treated copper foil.

One or more embodiments of the present application also relate to a printed circuit board including a circuit pattern formed by etching the surface treated copper foil of the copper clad laminate.

Advantageous Effects of Invention

According to one or more embodiments of the present application, a surface treated copper foil and a copper clad laminate that are excellent in adhesion to an insulating substrate, and are capable of forming a circuit pattern having a high etching factor suitable for the reduction in pitch can be provided.

According to one or more embodiments of the present application, a printed circuit board that has a circuit pattern having a high etching factor excellent in adhesion to an insulating substrate can also be provided.

BRIEF DESCRIPTION OF DRAWINGS

FIG. 1 is a cross sectional view showing a copper clad laminate using a surface treated copper foil of one or more embodiments of the present application.

FIG. 2 is an SEM micrograph showing a circuit pattern for explaining the etching residue.

FIG. 3 is a cross sectional view showing a copper clad laminate using a surface treated copper foil further having a second surface treatment layer of one or more embodiments of the present application.

FIG. 4 is a cross sectional view showing a production method of a printed circuit board by a subtractive method.

DESCRIPTION OF EMBODIMENTS

One or more preferred embodiments of the present application will be specifically described below, but the one or more embodiments of the present application are not limited thereto and may be subjected to various changes and improvements by a skilled person in the art unless the changes and improvements deviate the one or more embodiments of the present application. The plural constitutional elements described in the one or more embodiments may form various inventions through appropriate combinations thereof. For example, some of the constitutional elements may be deleted from all the constitutional elements shown in the one or more embodiments, and the constitutional elements of other one or more embodiments may be appropriately combined therewith.

FIG. 1 is a cross sectional view showing a copper clad laminate using a surface treated copper foil of one or more embodiments of the present application.

The surface treated copper foil 1 has a copper foil 2, and a first surface treatment layer 3 formed on one surface of the copper foil 2. The copper clad laminate 10 has the surface treated copper foil 1 and an insulating substrate 11 adhered to the first surface treatment layer 3 of the surface treated copper foil 1.

The first surface treatment layer 3 has a root mean square gradient of roughness curve elements $R\Delta q$ according to JIS B0601:2013 of 5 to 28°.

$R\Delta q$ is an index showing the inclination of the irregular shape of the surface. Larger $R\Delta q$ means an increased inclination of the irregular shape, and therefore, the adhesion force of the surface treated copper foil 1 to the insulating substrate 11 is increased, but portions remaining undissolved in the etching treatment tend to occur. Accordingly, a circuit pattern having a trapezoidal shape with a trailing bottom portion tends to occur in the etching treatment, and therefore, the etching factor tends to decrease. With smaller $R\Delta q$, a tendency opposite to the above tends to occur.

For achieving both the enhancement of the adhesion force to the insulating substrate 11 and the enhancement of the etching capability simultaneously, $R\Delta q$ of the first surface treatment layer 3 is controlled to the range. The surface of the first surface treatment layer 3 can have a surface shape that is suitable for achieving both the enhancement of the adhesion force to the insulating substrate 11 and the enhancement of the etching capability simultaneously by controlling $R\Delta q$ in this manner. Specifically, the irregular shape of the surface of the first surface treatment layer 3 can be in an appropriate state in inclination of the irregular shape of the surface thereof, and therefore, the etching factor of the circuit pattern and the adhesion thereof to the insulating substrate 11 can be enhanced. From the standpoint of the stable securement of the effects, $R\Delta q$ is preferably controlled to 10 to 25°, and more preferably controlled to 15 to 23°.

The first surface treatment layer 3 preferably has a kurtosis of a roughness curve Rku according to JIS B0601:2013 of 2.0 to 8.0.

Rku herein is an index showing the degree of sharpness of the irregularity distribution of the surface. Large Rku means that the distribution of the particle height is concentrated near the average, i.e., the dispersion of the particle height is suppressed. Accordingly, in the case where Rku is increased, the adhesion force of the surface treated copper foil 1 to the insulating substrate 11 is increased, and simultaneously the portions remaining undissolved in the etching treatment hardly occur. Accordingly, a circuit pattern having a trapezoidal shape with a trailing bottom portion hardly occurs in the etching treatment, and the etching factor tends to be enhanced. In the case where Rku is decreased, a tendency opposite to the above may occur. Accordingly, the etching factor tends to decrease, and the adhesion force of the surface treated copper foil 1 to the insulating substrate 11 tends to decrease.

For achieving both the enhancement of the adhesion force to the insulating substrate 11 and the enhancement of the etching capability simultaneously, Rku of the first surface treatment layer 3 is preferably controlled to the range. The surface of the first surface treatment layer 3 can have a surface shape that is suitable for achieving both the enhancement of the adhesion force to the insulating substrate 11 and the enhancement of the etching capability simultaneously by controlling Rku in this manner.

Rku of the first surface treatment layer 3 also relates to the etching residue. The etching residue is a residue that remains on the insulating substrate 11 around the circuit pattern after forming the circuit pattern by etching, and can be confirmed with an SEM micrograph (magnification: 3,000) of the circuit pattern shown in FIG. 2. A large amount of the etching residue is not preferred from the standpoint of the reduction in pitch of the circuit pattern since short circuit tends to occur in a circuit pattern with a small circuit width. Therefore, Rku is preferably controlled to the range for reducing the etching residue.

From the standpoint of the stable achievement of the effects (including the achievement of both the enhancement of the adhesion force to the insulating substrate 11 and the enhancement of the etching capability, and the decrease of the etching residue), Rku is preferably controlled to 3.5 to 5.8.

The first surface treatment layer 3 preferably has a* of a CIE L*a*b* color space measured according to the geometric condition C of JIS Z8730:2009 (which may be hereinafter referred to as "a*") of 3.0 to 28.0. a* is a value expressing red color, and copper exhibits color close to red. Accordingly, by controlling a* to the range, the amount of copper in the first surface treatment layer 3 can be controlled to a range that provides good solubility in the etching solution, and therefore, the etching factor of the circuit pattern can be enhanced. From the standpoint of the stable securement of the effect, a* is preferably controlled to 5.0 to 23.0.

The first surface treatment layer 3 preferably has a Cu concentration of 80 to 100 atm % based on the total amount of elements of C, N, O, Zn, Cr, Ni, Co, Si, and Cu, in an XPS depth profile obtained by performing sputtering at a sputtering rate of 2.5 nm/min (in terms of $SiO_2$) for 7 minutes. By controlling the Cu concentration to the range, the solubility to an etching solution can be controlled, and thereby the etching factor can be enhanced. From the standpoint of the stable securement of the effects, the Cu concentration is preferably controlled to 85 to 100 atm %.

In the description herein, the expression "performing sputtering at a sputtering rate of 2.5 nm/min (in terms of $SiO_2$) for 7 minutes" means "performing sputtering under condition that in the case where $SiO_2$ is sputtered, $SiO_2$ is sputtered at a sputtering rate of 2.5 nm/min for 7 minutes". More specifically, in one or more embodiments of the present application, the expression means that the first surface treatment layer 3 of the surface treated copper foil 1 of one or more embodiments of the present application is sputtered with $Ar^+$ accelerated at 3 kV in high vacuum.

The first surface treatment layer 3 preferably has an average length of roughness curve elements RSm according to JIS B0601:2013 of 5 to 10 μm.

RSm herein is an index showing the average distance of the irregular shape of the surface. In general, in the case where the size of particles forming the first surface treatment layer 3 is increased, RSm is increased since the distances of the irregular shape of the surface are expanded. In the case where RSm is increased, the adhesion force of the surface treated copper foil 1 to the insulating substrate 11 is increased, but portions remaining undissolved in the etching treatment tend to occur. Accordingly, a circuit pattern having a trapezoidal shape with a trailing bottom portion tends to occur in the etching treatment, and therefore, the etching factor tends to decrease. In the case where the size of particles forming the first surface treatment layer 3 is decreased, a tendency opposite to the above tends to occur. Accordingly, the etching factor is enhanced, but the adhesion force of the surface treated copper foil 1 to the insulating substrate 11 tends to decrease.

For achieving both the enhancement of the adhesion force to the insulating substrate 11 and the enhancement of the etching capability simultaneously, RSm of the first surface treatment layer 3 is preferably controlled to the range. The surface of the first surface treatment layer 3 can have a surface shape that is suitable for achieving both the enhancement of the adhesion force to the insulating substrate 11 and the enhancement of the etching capability simultaneously by controlling RSm in this manner. Specifically, the irregular shape of the surface of the first surface treatment layer 3 can be formed in a well balanced manner, and therefore, the etching factor of the circuit pattern and the adhesion to the insulating substrate 11 can be enhanced. From the standpoint of the stable securement of the effects, RSm is preferably controlled to 5 to 9 μm.

The first surface treatment layer 3 preferably has an average length of roughness motifs AR according to JIS B0631:2000 of 6 to 20 μm.

AR herein is an index showing the fine irregular shape of the surface. In general, in the case where the size of particles forming the first surface treatment layer 3 is increased, AR is increased since the distances of the irregular shape of the surface are expanded. In the case where AR is increased, the adhesion force of the surface treated copper foil 1 to the insulating substrate 11 is increased, but portions remaining undissolved in the etching treatment tend to occur. Accordingly, a circuit pattern having a trapezoidal shape with a trailing bottom portion tends to occur in the etching treatment, and therefore, the etching factor tends to decrease. In the case where the size of particles forming the first surface treatment layer 3 is decreased, a tendency opposite to the above tends to occur. Accordingly, the etching factor is enhanced, but the adhesion force of the surface treated copper foil 1 to the insulating substrate 11 tends to decrease.

For achieving both the enhancement of the adhesion force to the insulating substrate 11 and the enhancement of the etching capability simultaneously, AR of the first surface treatment layer 3 is preferably controlled to the range. The surface of the first surface treatment layer 3 can have a surface shape that is suitable for achieving both the enhancement of the adhesion force to the insulating substrate 11 and the enhancement of the etching capability simultaneously by controlling AR in this manner. Specifically, the irregular shape of the surface of the first surface treatment layer 3 can be formed in a well balanced manner, and therefore, the etching factor of the circuit pattern and the adhesion to the insulating substrate 11 can be enhanced. From the standpoint of the stable securement of the effects, AR is preferably controlled to 7 to 18 μm.

Rz of the first surface treatment layer 3 is not particularly limited, and is preferably from 0.3 to 1.5 μm, more preferably from 0.4 to 1.2 μm, and further preferably from 0.5 to 0.9 μm. By controlling Rz of the first surface treatment layer 3 to the range, both the adhesion to the insulating substrate 11 and the circuit formability can be simultaneously achieved.

In the description herein, "Rz" means the ten-point average roughness according to JIS B0601:1994.

The first surface treatment layer 3 preferably contains at least Ni and Zn as deposited elements.

Ni is a component that is hardly soluble in the etching solution, and therefore, by controlling the deposited amount of Ni of the first surface treatment layer 3 to 200 μg/dm$^2$ or less, the first surface treatment layer 3 becomes readily soluble in the etching solution. As a result, the etching factor of the circuit pattern can be enhanced. From the standpoint of the stable enhancement of the etching factor, the deposited amount of Ni of the first surface treatment layer 3 is preferably controlled to 180 μg/dm$^2$ or less, and more preferably 100 μg/dm$^2$ or less. From the standpoint of the securement of the prescribed effects (such as the heat resistance) by the first surface treatment layer 3, the deposited amount of Ni of the first surface treatment layer 3 may be controlled to 20 μg/dm$^2$ or more.

A surface treatment, such as gold plating, may be performed in some cases after forming the circuit pattern, and in the case where soft etching is performed as a pretreatment for removing unnecessary substances from the surface of the circuit pattern, the soft etching solution may infiltrate to the edge portion of the circuit pattern in some cases. Ni has an effect of preventing the infiltration of the soft etching solution. From the standpoint of the sufficient securement of the effect, the deposited amount of Ni of the first surface treatment layer 3 is preferably controlled to 30 μg/dm$^2$ or more, and more preferably controlled to 40 μg/dm$^2$ or more.

Zn is readily soluble in the etching solution as compared to Ni, and therefore, a relatively large amount thereof may be deposited. Accordingly, by controlling the deposited amount of Zn of the first surface treatment layer 3 to 1,000 μg/dm$^2$ or less, the first surface treatment layer 3 becomes readily soluble, and thereby the etching factor of the circuit pattern can be enhanced. From the standpoint of the stable enhancement of the etching factor, the deposited amount of Zn of the first surface treatment layer 3 is preferably controlled to 700 μg/dm$^2$ or less, and more preferably controlled to 600 μg/dm$^2$ or less. From the standpoint of the securement of the prescribed effects (such as the heat resistance and the chemical resistance) by the first surface treatment layer 3, the deposited amount of Zn of the first surface treatment layer 3 may be controlled to 20 μg/dm$^2$ or more, preferably 100 μg/dm$^2$ or more, and more preferably 300 μg/dm$^2$ or more. For example, Zn has a barrier effect of preventing heat diffusion of copper, and thus can suppress the roughening particles and copper in the copper foil from being exposed to the surface layer through the heat diffusion. As a result, copper can be prevented from being in direct contact with a chemical solution, such as a soft etching solution, and thereby the soft etching solution can be suppressed from infiltrating to the edge portion of the circuit pattern.

The first surface treatment layer 3 may contain elements, such as Co and Cr, as deposited elements, in addition to Ni and Zn.

The deposited amount of Co of the first surface treatment layer 3 is not particularly limited since the deposited amount thereof depends on the kind of the first surface treatment layer 3, and is preferably 1,500 μg/dm$^2$ or less, more preferably 500 μg/dm$^2$ or less, further preferably 100 μg/dm$^2$ or less, and particularly preferably 30 μg/dm$^2$ or less. By controlling the deposited amount of Co of the first surface treatment layer 3 to the range, the etching factor of the circuit pattern can be stably enhanced. The lower limit of the deposited amount of Co is not particularly limited, and is typically 0.1 μg/dm², and is preferably 0.5 μg/d m².

Since Co is a magnetic metal, the surface treated copper foil 1 that is capable of producing a printed circuit board excellent in high frequency characteristics can be obtained by suppressing the deposited amount of Co of the first surface treatment layer 3 particularly to 100 μg/dm² or less, and preferably 0.5 to 100 μg/dm².

The deposited amount of Cr of the first surface treatment layer 3 is not particularly limited since the deposited amount thereof depends on the kind of the first surface treatment layer 3, and is preferably 500 μg/dm² or less, more preferably from 0.5 to 300 μg/dm², and further preferably from 1 to 100 μg/dm². By controlling the deposited amount of Cr of the first surface treatment layer 3 to the range, a rust preventing effect can be obtained, and simultaneously the etching factor of the circuit pattern can be stably enhanced.

The kind of the first surface treatment layer 3 is not particularly limited, and various surface treatment layers having been known in this field of art may be used. Examples of the surface treatment layer used as the first surface treatment layer 3 include a roughening treatment layer, a heat resistant layer, a rust preventing layer, a chromate treatment layer, and a silane coupling treatment layer. These layers may be used solely or as a combination of two or more kinds thereof. Among these, the first surface treatment layer 3 preferably includes a roughening treatment layer from the standpoint of the adhesion to the insulating substrate 11.

In the description herein, the "roughening treatment layer" is a layer that is formed through a roughening treatment, and includes a layer of roughening particles. In the roughening treatment, there are some cases where ordinary copper plating or the like may be performed as a pretreatment thereof, and ordinary copper plating or the like may be performed as a finishing treatment for preventing the roughening particles from dropping off, and the "roughening treatment layer" in the description herein includes the layers formed through the pretreatment and the finishing treatment.

The roughening particles are not particularly limited, and may be formed of an elemental substance selected from the group consisting of copper, nickel, cobalt, phosphorus, tungsten, arsenic, molybdenum, chromium, and zinc, or an alloy containing at least one thereof. After forming the roughening particles, a roughening treatment may further be performed by providing secondary particles or tertiary particles formed of an elemental substance or an alloy of nickel, cobalt, copper, or zinc, or the like.

The roughening treatment layer may be formed through electroplating, the condition for which is not particularly limited, and the condition may be typically as follows. The electroplating may be performed by dividing into two stages.

Plating solution composition: 10 to 20 g/L of Cu and 50 to 100 g/L of sulfuric acid Plating solution temperature: 25 to 50° C.

Electroplating condition: current density of 1 to 60 A/dm² and a time of 1 to 10 seconds The heat resistant layer and the rust preventing layer are not particularly limited, and may be formed of materials having been known in this field of art. The heat resistant layer may function as the rust preventing layer in some cases, and therefore, one layer having both the functions of the heat resistant layer and the rust preventing layer may be formed as the heat resistant and rust preventing layer.

The heat resistant layer and/or the rust preventing layer may be a layer that contains at least one element (which may be in the form of any of a metal, an alloy, an oxide, a nitride, a sulfide, and the like) selected from the group consisting of nickel, zinc, tin, cobalt, molybdenum, copper, tungsten, phosphorus, arsenic, chromium, vanadium, titanium, aluminum, gold, silver, a platinum group element, iron, and tantalum. Examples of the heat resistant layer and/or the rust preventing layer include a layer containing a nickel-zinc alloy.

The heat resistant layer and the rust preventing layer may be formed through electroplating, the condition for which is not particularly limited, and the condition for a typical heat resistant layer (Ni—Zn layer) may be as follows.

Plating solution composition: 1 to 30 g/L of Ni and 1 to 30 g/L of Zn

Plating solution pH: 2 to 5

Plating solution temperature: 30 to 50° C.

Electroplating condition: current density of 1 to 10 A/dm² and a time of 0.1 to 5 seconds The chromate treatment layer is not particularly limited, and may be formed of materials having been known in this field of art.

In the description herein, the "chromate treatment layer" means a layer that is formed with a solution containing chromic anhydride, chromic acid, dichromic acid, a chromate salt, or a dichromate salt. The chromate treatment layer may be a layer that contains an element (which may be in the form of any of a metal, an alloy, an oxide, a nitride, a sulfide, and the like) of cobalt, iron, nickel, molybdenum, zinc, tantalum, copper, aluminum, phosphorus, tungsten, tin, arsenic, titanium, or the like. Examples of the chromate treatment layer include a chromate treatment layer that is formed by treating with a chromic anhydride or potassium dichromate aqueous solution, and a chromate treatment layer that is formed by treating with a treatment solution containing chromic anhydride or potassium dichromate, and zinc.

The chromate treatment layer may be formed by a known method, such as a dip chromate treatment and an electrolytic chromate treatment. The condition therefor is not particularly limited, and the condition for a typical dip chromate treatment layer is as follows.

Chromate solution composition: 1 to 10 g/L of $K_2Cr_2O_7$ and 0.01 to 10 g/L of Zn Chromate solution pH: 2 to 5

Chromate solution temperature: 30 to 50° C.

The silane coupling treatment layer is not particularly limited, and may be formed of materials having been known in this field of art.

In the description herein, the "silane coupling treatment layer" means a layer that is formed with a silane coupling agent.

The silane coupling agent is not particularly limited, and materials having been known in this field of art may be used. Examples of the silane coupling agent include an amino silane coupling agent, an epoxy silane coupling agent, a mercapto silane coupling agent, a methacryloxy silane coupling agent, a vinyl silane coupling agent, an imidazole silane coupling agent, and a triazine silane coupling agent. Among these, an amino silane coupling agent and an epoxy silane coupling agent are preferred. The silane coupling agent may be used solely or as a combination of two or more kinds thereof.

The silane coupling agent may be produced by a known method, and a commercially available product may also be used. Examples of the commercially available product that can be used as the silane coupling agent include KBM Series and KBE Series, produced by Shin-Etsu Chemical Co., Ltd. The commercially available product of the silane coupling agent may be used solely, and from the standpoint of the adhesion (peel strength) between the first surface treatment layer 3 and the insulating substrate 11, a mixture of two or more kinds of the silane coupling agents is preferably used. Examples of the preferred mixture of silane coupling agents among these include a mixture of KBM 603 (N-2-(aminoethyl)-3-aminopropyltrimethoxysilane) and KBM 503 (3-methacryloxypropyltrimethoxysilane), a mixture of KBM 602 (N-2-(aminoethyl)-3-aminopropyldimethoxysilane) and KBM 503 (3-methacryloxypropyltrimethoxysilane), a mixture of KBM 603 (N-2-(aminoethyl)-3-aminopropyltrimethoxysilane) and KBE 503 (3-methacryloxypropyltriethoxysilane), a mixture of KBM 602 (N-2-(aminoethyl)-3-aminopropyldimethoxysilane) and KBE 503 (3-methacryloxypropyltriethoxysilane), a mixture of KBM 903 (3-aminopropyltrimethoxysilane) and KBM 503 (3-methacryloxypropyltrimethoxysilane), a mixture of KBE 903 (3-aminotriethoxysilane) and KBM 503 (3-methacryloxypropyltrimethoxysilane), a mixture of KBE 903 (3-aminotriethoxysilane) and KBE 503 (3-methacryloxypropyltriethoxysilane), and a mixture of KBM 903 (3-aminopropyltrimethoxysilane) and KBE 503 (3-methacryloxypropyltriethoxysilane).

In the case where a mixture of two or more kinds of the silane coupling agents is used, the mixing ratio thereof is not particularly limited and may be appropriately controlled depending on the kinds of the silane coupling agents used.

As shown in FIG. 3, the surface treated copper foil 1 may further have a second surface treatment layer 4 on the opposite surface of the copper foil 2.

The kind of the second surface treatment layer 4 is not particularly limited, and as similar to the first surface treatment layer 3, various surface treatment layers having been known in this field of art may be used. The kind of the second surface treatment layer 4 may be the same as or different from the kind of the first surface treatment layer 3.

The second surface treatment layer 4 may contain elements, such as Ni, Zn, and Cr, as deposited elements.

The ratio of the deposited amount of Ni of the first surface treatment layer 3 to the deposited amount of Ni of the second surface treatment layer 4 is preferably from 0.01 to 2.5, and more preferably from 0.6 to 2.2. Ni is a component that is hardly soluble in the etching solution, and therefore, by controlling the ratio of the deposited amounts of Ni to the range, the dissolution of the first surface treatment layer 3 becoming the bottom of the circuit pattern can be enhanced, and the dissolution of the second surface treatment layer 4 becoming the top of the circuit pattern can be suppressed, in etching the copper clad laminate 10. Accordingly, a circuit pattern that has a small difference between the top width and the bottom width and has a high etching factor can be provided.

The deposited amount of Ni of the second surface treatment layer 4 is not particularly limited since the deposited amount depends on the kind of the second surface treatment layer 4, and is preferably from 0.1 to 500 µg/dm$^2$, more preferably from 0.5 to 200 µg/dm$^2$, and further preferably from 1 to 100 µg/dm$^2$. By controlling the deposited amount of Ni of the second surface treatment layer 4 to the range, the etching factor of the circuit pattern can be stably enhanced.

The deposited amount of Zn of the second surface treatment layer 4 is not particularly limited since the deposited amount depends on the kind of the second surface treatment layer 4, and in the case where the second surface treatment layer 4 contains Zn, is preferably from 10 to 1,000 µg/dm$^2$, more preferably from 50 to 500 µg/dm$^2$, and further preferably from 100 to 300 µg/dm$^2$. By controlling the deposited amount of Zn of the second surface treatment layer 4 to the range, effects including the heat resistance and the chemical resistance can be obtained, and the etching factor of the circuit pattern can be stably enhanced.

The deposited amount of Cr of the second surface treatment layer 4 is not particularly limited since the deposited amount depends on the kind of the second surface treatment layer 4, and in the case where the second surface treatment layer 4 contains Cr, is preferably more than 0 µg/dm$^2$ and 500 µg/dm$^2$ or less, more preferably from 0.1 to 100 µg/dm$^2$, and further preferably from 1 to 50 µg/dm$^2$. By controlling the deposited amount of Cr of the second surface treatment layer 4 to the range, the rust preventing effect can be obtained, and the etching factor of the circuit pattern can be stably enhanced.

The copper foil 2 is not particularly limited, and may be either an electrolytic copper foil or a rolled copper foil. An electrolytic copper foil is generally produced by electrolytically depositing copper from a copper sulfate plating bath onto a titanium or stainless steel drum, and has a flat S surface (shine surface) formed on the side of the drum and an M surface (matt surface) on the opposite side to the S surface. In general, the M surface of the electrolytic copper foil has irregularity, and the adhesion between the first surface treatment layer 3 and the insulating substrate 11 can be enhanced by forming the first surface treatment layer 3 on the M surface, and forming the second surface treatment layer 4 on the S surface.

The material of the copper foil 2 is not particularly limited, and in the case where the copper foil 2 is a rolled copper foil, high purity copper that is generally used as a circuit pattern of a printed circuit board, such as tough pitch copper (JIS H3100, alloy number: C1100) and oxygen-free copper (JIS H3100, alloy number: C1020, or JIS H3510, alloy number: C1011), may be used. Furthermore, for example, copper alloys, such as Sn-containing copper, Ag-containing copper, a copper alloy containing Cr, Zr, or Mg, and a Corson copper alloy containing Ni and Si, may also be used. In the description herein, the "copper foil 2" is a concept including a copper alloy foil.

The thickness of the copper foil 2 is not particularly limited, and may be, for example, from 1 to 1,000 µm, or from 1 to 500 µm, or from 1 to 300 µm, or from 3 to 100 µm, or from 5 to 70 µm, or from 6 to 35 µm, or from 9 to 18 µm.

The ten-point average roughness Rz of the surface of the surface treated copper foil 1 opposite to the first surface treatment layer 3 is not particularly limited, and is preferably from 0.3 to 1.0 µm, more preferably from 0.4 to 0.9 µm, and further preferably from 0.5 to 0.7 µm. The surface opposite to the first surface treatment layer 3 herein is the surface of the second surface treatment layer 4 in the case where the second surface treatment layer 4 is provided, and is the surface of the copper foil 2 in the case where the second surface treatment layer 4 is not provided.

By controlling the ten-point average roughness Rz of the surface opposite to the first surface treatment layer 3 to the range, the surface treated copper foil 1 that is capable of producing a printed circuit board excellent in high frequency characteristics can be provide.

The surface treated copper foil 1 having the aforementioned structure may be produced according to a method having been known in this field of art. The deposited amounts of Ni and the ratio of the deposited amounts of Ni of the first surface treatment layer 3 and the second surface treatment layer 4 can be controlled, for example, by changing the kinds, the thickness, and the like of the surface treatment layers formed. The ten-point average roughness Rz of the first surface treatment layer 3 can be controlled, for example, by controlling the formation condition and the like of the first surface treatment layer 3.

The copper clad laminate 10 can be produced by adhering the insulating substrate 11 to the first surface treatment layer 3 of the surface treated copper foil 1.

The insulating substrate 11 is not particularly limited, and materials having been known in this field of art may be used. Examples of the insulating substrate 11 include a paper base impregnated with a phenol resin, a paper base impregnated with an epoxy resin, a synthetic fiber base impregnated with an epoxy resin, a glass cloth-paper composite base impregnated with an epoxy resin, a glass cloth-glass nonwoven cloth composite base impregnated with an epoxy resin, glass cloth base impregnated with an epoxy resin, a polyester film, a polyimide film, a liquid crystal polymer, and a fluorine resin.

The adhesion method of the surface treated copper foil 1 and the insulating substrate 11 is not particularly limited, and the adhesion may be performed by a method having been known in this field of art. For example, the surface treated copper foil 1 and the insulating substrate 11 may be laminated and subjected to thermocompression bonding.

The copper clad laminate 10 produced in the aforementioned manner may be used for the production of a printed circuit board. The production method of the printed circuit board is not particularly limited, and a known method, such as a subtractive method and a semi-additive method, may be used. Among these, the copper clad laminate 10 is optimum for the production by a subtractive method.

FIG. 4 is a cross sectional view showing a production method of a printed circuit board by a subtractive method.

In FIG. 4, firstly, a resist is coated on the surface of the surface treated copper foil 1 of the copper clad laminate 10, and then exposed and developed to form a prescribed resist pattern 20 (step (a)). Subsequently, the surface treated copper foil 1 on the portion having no resist pattern 20 formed (i.e., the unnecessary portion) is removed by etching (step (b)). Finally, the resist pattern 20 on the surface treated copper foil 1 is removed (step (c)).

The conditions in the subtractive method are not particularly limited, and the method may be performed under conditions having been known in this field of art.

EXAMPLES

One or more embodiments of the present application will be described more specifically with reference to examples below, but one or more embodiments of the present application are not limited to the examples.

Example 1

A rolled copper foil having a thickness of 12 μm (HA-V2 Foil, produced by JX Nippon Mining & Metals Corporation) was prepared. On one surface of the copper foil, a roughening treatment layer, a heat resistant layer, and a chromate treatment layer were serially formed as the first surface treatment layer, and on the other surface thereof, a heat resistant layer and a chromate treatment layer were serially formed as the second surface treatment layer, so as to provide a surface treated copper foil. The conditions for forming the layers were as follows.

<Roughening Treatment Layer of First Surface Treatment Layer>

The roughening treatment layer was formed by electroplating. The electroplating was performed by dividing to two stages.

(Condition for First Stage)
Plating solution composition: 11 g/L of Cu and 50 g/L of sulfuric acid
Plating solution temperature: 25° C.
Electroplating condition: current density of 42.7 A/dm$^2$ and a time of 1.4 seconds (Condition for Second Stage)
Plating solution composition: 20 g/L of Cu and 100 g/L of sulfuric acid
Plating solution temperature: 50° C.
Electroplating condition: current density of 3.8 A/dm$^2$ and a time of 2.8 seconds <Heat Resistant Layer of First Surface Treatment Layer>

The heat resistant layer was formed by electroplating.
Plating solution composition: 23.5 g/L of Ni and 4.5 g/L of Zn
Plating solution pH: 3.6
Plating solution temperature: 40° C.
Electroplating condition: current density of 1.1 A/dm$^2$ and a time of 0.7 second <Chromate Treatment Layer of First Surface Treatment Layer>

The chromate treatment layer was formed by electroplating.
Plating solution composition: 3.0 g/L of $K_2Cr_2O_7$ and 0.33 g/L of Zn
Plating solution pH: 3.6
Plating solution temperature: 50° C.
Electroplating condition: current density of 2.1 A/dm$^2$ and a time of 1.4 seconds <Heat Resistant Layer of Second Surface Treatment Layer>

The heat resistant layer was formed by electroplating.
Plating solution composition: 23.5 g/L of Ni and 4.5 g/L of Zn
Plating solution pH: 3.6
Plating solution temperature: 40° C.
Electroplating condition: current density of 2.8 A/dm$^2$ and a time of 0.7 second <Chromate Treatment Layer of Second Surface Treatment Layer>

The chromate treatment layer was formed by a dip chromate treatment.
Chromate solution composition: 3.0 g/L of $K_2Cr_2O_7$ and 0.33 g/L of Zn
Chromate solution pH: 3.6
Chromate solution temperature: 50° C.

Example 2

A surface treated copper foil was obtained in the same manner as in Example 1 except that the formation condition of the heat resistant layer of the first surface treatment layer was changed as follows.

<Heat Resistant Layer of First Surface Treatment Layer>

The heat resistant layer was formed by electroplating.
Plating solution composition: 23.5 g/L of Ni and 4.5 g/L of Zn
Plating solution pH: 3.6
Plating solution temperature: 40° C.

Electroplating condition: current density of 1.6 A/dm$^2$ and a time of 0.7 second Example 3

A surface treated copper foil was obtained in the same manner as in Example 1 except that the formation condition of the heat resistant layer of the first surface treatment layer was changed as follows.
<Heat Resistant Layer of First Surface Treatment Layer>
The heat resistant layer was formed by electroplating.
Plating solution composition: 23.5 g/L of Ni and 4.5 g/L of Zn
Plating solution pH: 3.6
Plating solution temperature: 40° C.
Electroplating condition: current density of 2.6 A/dm$^2$ and a time of 0.7 second Example 4

A surface treated copper foil was obtained in the same manner as in Example 1 except that the formation condition of the heat resistant layer of the first surface treatment layer was changed as follows.
<Heat Resistant Layer of First Surface Treatment Layer>
The heat resistant layer was formed by electroplating.
Plating solution composition: 23.5 g/L of Ni and 4.5 g/L of Zn
Plating solution pH: 3.6
Plating solution temperature: 40° C.
Electroplating condition: current density of 3.2 A/dm$^2$ and a time of 0.7 second Example 5

A surface treated copper foil was obtained in the same manner as in Example 1 except that the formation condition of the heat resistant layer of the first surface treatment layer was changed as follows.
<Heat Resistant Layer of First Surface Treatment Layer>
The heat resistant layer was formed by electroplating.
Plating solution composition: 23.5 g/L of Ni and 4.5 g/L of Zn
Plating solution pH: 3.6
Plating solution temperature: 40° C.
Electroplating condition: current density of 4.2 A/dm$^2$ and a time of 0.7 second Example 6

A surface treated copper foil was obtained in the same manner as in Example 1 except that the formation conditions of the heat resistant layers of the first surface treatment layer and the second surface treatment layer were changed as follows.
<Heat Resistant Layer of First Surface Treatment Layer>
The heat resistant layer was formed by electroplating.
Plating solution composition: 23.5 g/L of Ni and 4.5 g/L of Zn
Plating solution pH: 3.6
Plating solution temperature: 40° C.
Electroplating condition: current density of 2.1 A/dm$^2$ and a time of 0.7 second <Heat Resistant Layer of Second Surface Treatment Layer>
The heat resistant layer was formed by electroplating.
Plating solution composition: 23.5 g/L of Ni and 4.5 g/L of Zn
Plating solution pH: 3.6
Plating solution temperature: 40° C.
Electroplating condition: current density of 3.3 A/dm$^2$ and a time of 0.7 second Comparative Example 1

A rolled copper foil having a thickness of 12 μm (HA-V2 Foil, produced by JX Nippon Mining & Metals Corporation) was prepared. On one surface of the copper foil, a roughening treatment layer, a heat resistant layer, and a chromate treatment layer, were serially formed as the first surface treatment layer, and on the other surface thereof, a heat resistant layer and a chromate treatment layer were serially formed as the second surface treatment layer, so as to provide a surface treated copper foil. The conditions for forming the layers were as follows.
<Roughening Treatment Layer of First Surface Treatment Layer>
The roughening treatment layer was formed by electroplating.
Plating solution composition: 15 g/L of Cu, 7.5 g/L of Co, and 9.5 g/L of Ni
Plating solution pH: 2.4
Plating solution temperature: 36° C.
Electroplating condition: current density of 31.5 A/dm$^2$ and a time of 1.8 seconds
<Heat Resistant Layer (1) of First Surface Treatment Layer>
The heat resistant layer (1) was formed by electroplating.
Plating solution composition: 3 g/L of Co and 13 g/L of Ni
Plating solution pH: 2.0
Plating solution temperature: 50° C.
Electroplating condition: current density of 19.1 A/dm$^2$ and a time of 0.4 second
<Heat Resistant Layer (2) of First Surface Treatment Layer>
The heat resistant layer (2) was formed by electroplating.
Plating solution composition: 23.5 g/L of Ni and 4.5 g/L of Zn
Plating solution pH: 3.6
Plating solution temperature: 40° C.
Electroplating condition: current density of 3.5 A/dm$^2$ and a time of 0.4 second
<Chromate Treatment Layer of First Surface Treatment Layer>
The chromate treatment layer was formed by a dip chromate treatment.
Chromate solution composition: 3 g/L of $K_2Cr_2O_7$ and 0.33 g/L of Zn
Chromate solution pH: 3.6
Chromate solution temperature: 50° C.
<Heat Resistant Layer of Second Surface Treatment Layer>
The heat resistant layer was formed by electroplating.
Plating solution composition: 23.5 g/L of Ni and 4.5 g/L of Zn
Plating solution pH: 3.6
Plating solution temperature: 40° C.
Electroplating condition: current density of 4.1 A/dm$^2$ and a time of 0.4 second <Chromate Treatment Layer of Second Surface Treatment Layer>

The chromate treatment layer was formed by a dip chromate treatment.

Chromate solution composition: 3 g/L of $K_2Cr_2O_7$ and 0.33 g/L of Zn

Chromate solution pH: 3.6

Chromate solution temperature: 50° C.

The surface treated copper foils obtained in Examples and Comparative Example above were subjected to the following evaluations.

<Measurement of Deposited Amounts of Elements in First Surface Treatment Layer and Second Surface Treatment Layer>

The deposited amounts of Ni, Zn, and Co were measured in such a manner that the surface treatment layer was dissolved in nitric acid having a concentration of 20 mass %, and subjected to quantitative analysis by the atomic absorption method with an atomic absorption spectrometer produced by Varian, Inc. (Model AA240FS). The deposited amount of Cr was measured in such a manner that the surface treatment layer was dissolved in hydrochloric acid having a concentration of 7 mass %, and subjected to quantitative analysis by the atomic absorption method in the same manner as above.

<Measurement of Root Mean Square Gradient $R\Delta q$ and Average Length RSm of Roughness Curve Elements and Kurtosis of Roughness Curve Rku of First Surface Treatment Layer of Surface Treated Copper Foil>

$R\Delta q$, RSm, and Rku were measured according to JIS B0601:2013 with a laser microscope (LEXT OLS4000), produced by Olympus Corporation. For each of $R\Delta q$, RSm, and Rku, the average value of measured values at arbitrary 10 positions was designated as the measurement result. The temperature in the measurement was from 23 to 25° C. The major set condition in the laser microscope was as follows.

Objective lens: MPLAPON 50LEXT (magnification: 50, numerical aperture: 0.95, immersion medium: air, mechanical tube length: ∞, cover glass thickness: 0, field number: FN18)

Optical zoom magnification: 1

Scanning mode: high precision in XYZ (height resolution: 10 nm)

Image capture size (number of pixels): 257 μm crosswise×258 μm lengthwise (1024×1024) (corresponding to 257 μm as evaluation length in measurement in crosswise direction)

DIC: off

Multilayer: off

Laser intensity: 100

Offset: 0

Confocal level: 0

Beam diameter limiting: off

Image average: 1

Noise reduction: on

Brightness unevenness correction: on

Optical noise filter: on

Cutoff: none (none in all λc, λs, λf)

Filter: Gaussian filter

Noise removal: premeasurement

Tilt correction: performed

Identification value of minimum height: 10% of Rz

<Measurement of a* of First Surface Treatment Layer of Surface Treated Copper Foil> a* of CIE L*a*b* color space was measured according to JIS Z8730:2009 with MiniScan (registered trade name) EZ Model 4000L, produced by Hunter Associates Laboratory, Inc. as a measuring equipment. Specifically, the first surface treatment layer of the surface treated copper foil obtained in Examples and Comparative Examples was pressed on the sensor of the measuring equipment to cut off external light, and a* thereof was measured. The measurement of a* was performed according to the geometric condition C of JIS Z8722. The major set condition in the measuring equipment was as follows.

Optical system: d/8°, integrating sphere size: 63.5 mm, observation light source: D65

Measurement method: reflection

Illumination diameter: 25.4 mm

Measurement diameter: 20.0 mm

Measurement wavelength and interval: 400 to 700 nm, 10 nm

Light source: pulse xenon lamp, one pulse per measurement

Traceability standard: calibration according to National Institute of Standards and Technology (NIST) based on CIE 44 and ASTM E259

Standard observer: 10°

The white tile as the measurement reference had the following object color.

X: 81.90, Y: 87.02, Z: 93.76 in CIE XYZ color space measured at D65/10° (corresponding to L*: 94.8, a*: −1.6, b*: 0.7 in CIE L*a*b* color space)

<Measurement of Cu Concentration in XPS Depth Profile of First Surface Treatment Layer of Surface Treated Copper Foil>

The first surface treatment layer of the surface treated copper foil was subjected to XPS analysis in the depth direction, and the concentration of Cu based on the total amount of the measured elements was measured when sputtering was performed at a sputtering rate of 2.5 nm/min (in terms of $SiO_2$) for 7 minutes. The other condition for the XPS depth profile was as follows.

Equipment: 5600MC, produced by Ulvac-Phi, Inc.

Ultimate vacuum degree: $5.7 \times 10^{-7}$ Pa

Excitation source: monochromatized MgKα

Output power: 400 W

Detection area: 800 μm in diameter

Incident angle: 81°

Take off angle: 45°

Neutralization gun: none

Element to be measured: C, N, O, Zn, Cr, Ni, Co, Si, and Cu

<Sputtering Condition>

Ion species: $Ar^+$

Acceleration voltage: 3 kV

Sweep area: 3 mm×3 mm

<Measurement of Average Length of Roughness Motifs AR of First Surface Treatment Layer of Surface Treated Copper Foil>

AR was measured according to JIS B0631:2000 with a laser microscope (LEXT OLS4000), produced by Olympus Corporation. For AR, the average value of measured values at arbitrary 10 positions was designated as the measurement result. The temperature in the measurement was from 23 to 25° C. The major set condition in the laser microscope was as follows.

Objective lens: MPLAPON 50LEXT (magnification: 50, numerical aperture: 0.95, immersion medium: air, mechanical tube length: ∞, cover glass thickness: 0, field number: FN18)

Scanning mode: high precision in XYZ (height resolution: 10 nm)
Optical zoom magnification: 1
Image capture size (number of pixels): 257 μm crosswise×258 μm lengthwise (1024×1024) (corresponding to 257 μm as evaluation length in measurement in crosswise direction)
DIC: off
Multilayer: off
Laser intensity: 100
Offset: 0
Confocal level: 0
Beam diameter limiting: off
Image average: 1
Noise reduction: on
Brightness unevenness correction: on
Optical noise filter: on
Cutoff: none (none in all λc, λs, λf)
Filter: Gaussian filter
Noise removal: premeasurement
Tilt correction: performed
Motif parameter: upper limit height of roughness motif A/upper limit height of waviness motif B=0.1 mm/0.5 mm
<Measurement of Rz of First Surface Treatment Layer and Second Surface Treatment Layer of Surface Treated Copper Foil>
Rz (ten-point average roughness) was measured according to JIS B0601:1994 with a contact roughness meter, Surfcorder SE-3C, produced by Kosaka Laboratory, Ltd. The measurement was performed with a measurement reference length of 0.8 mm, an evaluation length of 4 mm, a cutoff value of 0.25 mm, and a feed speed of 0.1 mm/sec, 10 times while changing the measurement position in the width direction of the surface treated copper foil, and the average value of the 10 measured values was designated as the evaluation result.

Rz of the second surface treatment layer was measured only on Example 3. In the other examples, the value of Rz was assumed to be the same as in Example 3 since the production lot of the rolled copper foil was the same as in Example 3.
<Evaluation of Etching Factor and Etching Residue>
A polyimide substrate was laminated on the first surface treatment layer of the surface treated copper foil and subjected to thermocompression bonding at 300° C. for 1 hour, so as to produce a copper clad laminate. A photosensitive resist was coated on the second surface treatment layer of the surface treated copper foil, and then exposed and developed to form a resist pattern having widths L/S=29 μm/21 μm. Thereafter, the exposed portion (i.e., the unnecessary portion) of the surface treated copper foil was removed by etching, so as to provide a printed circuit board having a copper circuit pattern having widths L/S=25 μm/25 μm. The widths L and S of the circuit pattern were the widths of the bottom of the circuit, i.e., the surface thereof in contact with the polyimide substrate. The etching was performed by spray etching under the following condition.

Etching solution: copper chloride etching solution (copper(II) chloride dihydrate: 400 g/L, 35% hydrochloric acid: 200 mL/L)
Solution temperature: 45° C.
Spray pressure: 0.18 MPa
Subsequently, the circuit pattern formed was observed with SEM, and the etching factor (EF) was obtained according to the following expression.

EF=(circuit height)/((circuit bottom width−circuit top width)/2)

A larger value of the etching factor means a larger tilt angle of the side wall of the circuit.

The value of EF was an average value of the results of five experiments for each of Examples and Comparative Example.

The etching residue was evaluated by the occurrence state thereof from an SEM micrograph of the circuit pattern with a magnification of 3,000. Specifically, as shown in FIG. 2, straight lines were drawn perpendicular to the circuit pattern, and the maximum value of the distances from the bottom of the circuit pattern to the positions where the etching residue was formed was obtained to evaluate the etching residue. In this evaluation, a specimen having the maximum value of the distance of 1 μm or less was evaluated as "good", and a specimen having the maximum value of the distance exceeding 1 μm was evaluated as "poor".
<Evaluation of Peel Strength>
The 90° peel strength was measured according to JIS C6471:1995. Specifically, the strength was measured when the circuit (surface treated copper foil) having a width of 3 mm was peeled at the interface between the commercially available substrate (FR-4 prepreg) and the surface treated copper foil at an angle of 90° and a rate of 50 mm/min. The measurement was performed twice, and the average value thereof was designated as the result of the peel strength. A peel strength of 0.5 kgf/cm or more can be said to provide good adhesion between the conductor and the substrate.

The circuit width was prepared by the ordinary subtractive etching method using a copper chloride etching solution. The peel strength was evaluated under two conditions, i.e., in the initial stage (immediately after etching) and after a heat history corresponding to solder reflow (260° C., 20 seconds).

The evaluation results are shown in Tables 1 and 2. Rz of the second surface treatment layers of Examples 1 to 6 was 0.61 μm. Rz of the second surface treatment layer of Comparative Example 1 was not measured.

TABLE 1

|  | First surface treatment layer | | | | Second surface treatment layer | | |
| --- | --- | --- | --- | --- | --- | --- | --- |
|  | Deposited amount of Ni (μg/dm$^2$) | Deposited amount of Zn (μg/dm$^2$) | Deposited amount of Co (μg/dm$^2$) | Deposited amount of Cr (μg/dm$^2$) | Deposited amount of Ni (μg/dm$^2$) | Deposited amount of Zn (μg/dm$^2$) | Deposited amount of Cr (μg/dm$^2$) |
| Example 1 | 52 | 166 | 0 | 50 | 67 | 321 | 22 |
| Example 2 | 65 | 256 | 0 | 50 | 67 | 321 | 22 |
| Example 3 | 93 | 419 | 0 | 48 | 67 | 321 | 22 |
| Example 4 | 103 | 479 | 0 | 48 | 67 | 321 | 22 |

TABLE 1-continued

| | First surface treatment layer | | | | Second surface treatment layer | | |
|---|---|---|---|---|---|---|---|
| | Deposited amount of Ni (μg/dm²) | Deposited amount of Zn (μg/dm²) | Deposited amount of Co (μg/dm²) | Deposited amount of Cr (μg/dm²) | Deposited amount of Ni (μg/dm²) | Deposited amount of Zn (μg/dm²) | Deposited amount of Cr (μg/dm²) |
| Example 5 | 146 | 615 | 0 | 50 | 67 | 321 | 22 |
| Example 6 | 77 | 346 | 0 | 50 | 93 | 375 | 22 |
| Comparative Example 1 | 830 | 260 | 2280 | 79 | 64 | 288 | 19 |

TABLE 2

| | | | | | Cu | | | | | Peel strength (kgf/cm) | |
|---|---|---|---|---|---|---|---|---|---|---|---|
| | RΔq (°) | Rku | RSm (μm) | a* | concentration (atm %) | AR (μm) | Rz (μm) | EF | Etching residue | Initial | after heat history |
| Example 1 | 22.52 | 4.00 | 6.89 | 21.19 | 95 | 9.60 | 0.74 | 3.5 | good | 0.66 | 0.62 |
| Example 2 | 20.71 | 5.64 | 6.81 | 16.74 | 93 | 12.15 | 0.72 | 4.1 | good | 0.63 | 0.60 |
| Example 3 | 16.34 | 4.73 | 8.65 | 12.04 | 93 | 9.46 | 0.66 | 4.0 | good | 0.66 | 0.62 |
| Example 4 | 21.65 | 3.69 | 6.27 | 11.12 | 95 | 8.72 | 0.69 | 3.6 | good | 0.63 | 0.58 |
| Example 5 | 20.82 | 4.12 | 7.50 | 5.58 | 95 | 10.00 | 0.73 | 3.7 | good | 0.66 | 0.62 |
| Example 6 | 19.27 | 4.32 | 7.75 | 13.53 | 94 | 10.35 | 0.70 | 3.8 | good | 0.61 | 0.58 |
| Comparative Example 1 | 30.10 | 3.50 | 4.22 | 1.55 | 67 | 5.47 | 0.68 | 2.6 | poor | 0.71 | 0.69 |

As shown in Tables 1 and 2, the surface treated copper foils of Examples 1 to 6 each having RΔq of the first surface treatment layer of 5 to 28° exhibited a high etching factor and a high peel strength, but Comparative Example 1 having RΔq of the first surface treatment layer exceeding 28° exhibited a low etching factor. Examples 1 to 6 exhibited a high peel strength not only in the initial stage but also after the heat history.

It is understood from the aforementioned results that one or more embodiments of the present application can provide a surface treated copper foil and a copper clad laminate that are excellent in adhesion to an insulating substrate, and are capable of forming a circuit pattern having a high etching factor suitable for the reduction in pitch. Furthermore, one or more embodiments of the present application can provide a printed circuit board that has a circuit pattern having a high etching factor excellent in adhesion to an insulating substrate.

One or more embodiments of the present application may also be in the following embodiments.
<1>
A surface treated copper foil including
a copper foil, and
a first surface treatment layer formed on one surface of the copper foil,
wherein the first surface treatment layer has a root mean square gradient of roughness curve elements RΔq according to JIS B0601:2013 of 5 to 28°.
<2>
The surface treated copper foil according to the item <1>, wherein the RΔq is from 10 to 25°.
<3>
The surface treated copper foil according to the item <1>, wherein the RΔq is from 15 to 23°.
<4>
The surface treated copper foil according to any one of the items <1> to <3>, wherein the first surface treatment layer has a kurtosis of a roughness curve Rku according to JIS B0601:2013 of 2.0 to 8.0.
<5>
The surface treated copper foil according to the item <4>, wherein the Rku is from 3.5 to 5.8.
<6>
The surface treated copper foil according to any one of the items <1> to <5>, wherein the first surface treatment layer has a* of a CIE L*a*b* color space of 3.0 to 28.0.
<7>
The surface treated copper foil according to the item <6>, wherein the a* is from 5.0 to 23.0.
<8>
The surface treated copper foil according to any one of the items <1> to <7>, wherein the first surface treatment layer has a Ni deposited amount of 20 to 200 μg/dm² and a Zn deposited amount of 20 to 1,000 μg/dm².
<9>
The surface treated copper foil according to any one of the items <1> to <8>, wherein the first surface treatment layer has a Cu concentration of 80 to 100 atm % based on the total amount of elements of C, N, O, Zn, Cr, Ni, Co, Si, and Cu, in an XPS depth profile obtained by performing sputtering at a sputtering rate of 2.5 nm/min (in terms of SiO$_2$) for 7 minutes.
<10>
The surface treated copper foil according to any one of the items <1> to <9>, wherein the first surface treatment layer satisfies at least one of the following items (A) to (F):
(A) a kurtosis of a roughness curve Rku according to JIS B0601:2013 of 2.0 to 8.0;
(B) a* of a CIE L*a*b* color space measured according to the geometric condition C of JIS Z8730:2009 of 3.0 to 28.0;
(C) a Cu concentration of 80 to 100 atm % based on the total amount of elements of C, N, O, Zn, Cr, Ni, Co, Si, and Cu, in an XPS depth profile obtained by performing sputtering at a sputtering rate of 2.5 nm/min (in terms of SiO$_2$) for 7 minutes;

(D) an average length of roughness curve elements RSm according to JIS B0601:2013 of 5 to 10 μm;
(E) an average length of roughness motifs AR according to JIS B0631:2000 of 6 to 20 μm; and
(F) a ten-point average roughness Rz according to JIS B0601:1994 of 0.3 to 1.5 μm.

<11>

The surface treated copper foil according to any one of the items <1> to <10>, wherein a surface of the surface treated copper foil opposite to the first surface treatment layer has a ten-point average roughness Rz of 0.3 to 1.0 μm.

<12>

The surface treated copper foil according to any one of the items <1> to <11>, wherein the copper foil is a rolled copper foil.

<13>

A copper clad laminate including
the surface treated copper foil according to any one of the items <1> to <12>, and
an insulating substrate adhered to the first surface treatment layer of the surface treated copper foil.

<14>

A printed circuit board including a circuit pattern formed by etching the surface treated copper foil of the copper clad laminate according to the item <13>.

REFERENCE SIGN LIST

1 Surface treated copper foil
2 Copper foil
3 First surface treatment layer
4 Second surface treatment layer
10 Copper clad laminate
11 Insulating substrate
20 Resist pattern

The invention claimed is:

1. A surface treated copper foil comprising
a copper foil, and
a first surface treatment layer formed on one surface of the copper foil,
wherein the first surface treatment layer comprises a root mean square gradient of roughness curve elements RΔq according to JIS B0601:2013 of 5° to 28°.

2. The surface treated copper foil according to claim 1, wherein the RΔq is from 10° to 25°.

3. The surface treated copper foil according to claim 1, wherein the RΔq is from 15° to 23°.

4. The surface treated copper foil according to claim 1, wherein the first surface treatment layer comprises a kurtosis of a roughness curve Rku according to JIS B0601:2013 of 2.0 to 8.0.

5. The surface treated copper foil according to claim 4, wherein the Rku is from 3.5 to 5.8.

6. The surface treated copper foil according to claim 1, wherein the first surface treatment layer comprises a* of a CIE L*a*b* color space of 3.0 to 28.0.

7. The surface treated copper foil according to claim 6, wherein the a* is from 5.0 to 23.0.

8. The surface treated copper foil according to claim 1, wherein the first surface treatment layer comprises a Ni deposited amount of 20 to 200 μg/dm² and a Zn deposited amount of 20 to 1,000 μg/dm².

9. The surface treated copper foil according to claim 1, wherein the first surface treatment layer comprises a Cu concentration of 80 to 100 atm % based on the total amount of elements of C, N, O, Zn, Cr, Ni, Co, Si, and Cu, in an XPS depth profile obtained by performing sputtering at a sputtering rate of 2.5 nm/min (in terms of SiO₂) for 7 minutes.

10. The surface treated copper foil according to claim 1, wherein the first surface treatment layer satisfies at least one of the following items (A) to (F):
(A) a kurtosis of a roughness curve Rku according to JIS B0601:2013 of 2.0 to 8.0;
(B) a* of a CIE L*a*b* color space measured according to the geometric condition C of JIS Z8730:2009 of 3.0 to 28.0;
(C) a Cu concentration of 80 to 100 atm % based on the total amount of elements of C, N, O, Zn, Cr, Ni, Co, Si, and Cu, in an XPS depth profile obtained by performing sputtering at a sputtering rate of 2.5 nm/min (in terms of SiO₂) for 7 minutes;
(D) an average length of roughness curve elements RSm according to JIS B0601:2013 of 5 to 10 μm;
(E) an average length of roughness motifs AR according to JIS B0631:2000 of 6 to 20 μm; and
(F) a ten-point average roughness Rz according to JIS B0601:1994 of 0.3 to 1.5 μm.

11. The surface treated copper foil according to claim 1, wherein a surface of the surface treated copper foil opposite to the first surface treatment layer comprises a ten-point average roughness Rz according to JIS B0601:1994 of 0.3 to 1.0 μm.

12. The surface treated copper foil according to claim 1, wherein the copper foil is a rolled copper foil.

13. A copper clad laminate comprising
the surface treated copper foil according to claim 1, and
an insulating substrate adhered to the first surface treatment layer of the surface treated copper foil.

14. A printed circuit board comprising a circuit pattern formed by etching the surface treated copper foil of the copper clad laminate according to claim 13.

15. The surface treated copper foil according to claim 4, wherein the first surface treatment layer comprises a* of a CIE L*a*b* color space of 5.0 to 23.0.

16. The surface treated copper foil according to claim 4, wherein the first surface treatment layer comprises a Ni deposited amount of 20 to 200 μg/dm² and a Zn deposited amount of 20 to 1,000 μg/dm².

17. The surface treated copper foil according to claim 4, wherein the first surface treatment layer comprises a Cu concentration of 80 to 100 atm % based on the total amount of elements of C, N, O, Zn, Cr, Ni, Co, Si, and Cu, in an XPS depth profile obtained by performing sputtering at a sputtering rate of 2.5 nm/min (in terms of SiO₂) for 7 minutes.

18. The surface treated copper foil according to claim 15, wherein the first surface treatment layer comprises a Ni deposited amount of 20 to 200 μg/dm² and a Zn deposited amount of 20 to 1,000 μg/dm².

19. The surface treated copper foil according to claim 15, wherein the first surface treatment layer comprises a Cu concentration of 80 to 100 atm % based on the total amount of elements of C, N, O, Zn, Cr, Ni, Co, Si, and Cu, in an XPS depth profile obtained by performing sputtering at a sputtering rate of 2.5 nm/min (in terms of SiO₂) for 7 minutes.

20. The surface treated copper foil according to claim 1, wherein the first surface treatment layer satisfies five or six of the following items (A) to (F):
(A) a kurtosis of a roughness curve Rku according to JIS B0601:2013 of 2.0 to 8.0;
(B) a* of a CIE L*a*b* color space measured according to the geometric condition C of JIS Z8730:2009 of 3.0 to 28.0;

(C) a Cu concentration of 80 to 100 atm % based on the total amount of elements of C, N, O, Zn, Cr, Ni, Co, Si, and Cu, in an XPS depth profile obtained by performing sputtering at a sputtering rate of 2.5 nm/min (in terms of $SiO_2$) for 7 minutes;
(D) an average length of roughness curve elements RSm according to JIS B0601:2013 of 5 to 10 μm;
(E) an average length of roughness motifs AR according to JIS B0631:2000 of 6 to 20 μm; and
(F) a ten-point average roughness Rz according to JIS B0601:1994 of 0.3 to 1.5 μm.

* * * * *